(12) United States Patent
Wang et al.

(10) Patent No.: US 8,222,063 B2
(45) Date of Patent: Jul. 17, 2012

(54) METHOD FOR FABRICATING ROBUST LIGHT-EMITTING DIODES

(75) Inventors: Li Wang, Nanchang (CN); Fengyi Jiang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 18 days.

(21) Appl. No.: 12/160,044

(22) PCT Filed: Mar. 26, 2008

(86) PCT No.: PCT/CN2008/000596
§ 371 (c)(1),
(2), (4) Date: Jul. 3, 2008

(87) PCT Pub. No.: WO2009/117484
PCT Pub. Date: Oct. 1, 2009

(65) Prior Publication Data
US 2011/0049540 A1    Mar. 3, 2011

(51) Int. Cl.
*H01L 21/00* (2006.01)
(52) U.S. Cl. ............. 438/38; 257/94; 257/E33.028; 257/E21.085
(58) Field of Classification Search ............ 257/94, 257/55, 57, 92, E33.028, E21.085; 438/38, 438/30, 48, 128
See application file for complete search history.

(56) References Cited

U.S. PATENT DOCUMENTS

| | | | |
|---|---|---|---|
| 7,271,426 | B2 | 9/2007 | Horio |
| 2002/0137245 | A1 | 9/2002 | Kitamura |
| 2005/0039673 | A1 | 2/2005 | Ishida |

*Primary Examiner* — Tony Tran
(74) *Attorney, Agent, or Firm* — Shun Yao; Park, Vaughan, Fleming & Dowler LLP

(57) ABSTRACT

One embodiment of the present invention provides a method for fabricating light-emitting diodes (LEDs). The method includes fabricating an InGaAlN-based multilayer LED structure on a conductive substrate. The method further includes etching grooves of a predetermined pattern through the active region of the multilayer LED structure. The grooves separate a light-emitting region from non-light-emitting regions. In addition, the method includes depositing electrode material on the light-emitting and non-light-emitting regions, thereby creating an electrode. Furthermore, the method includes depositing a passivation layer covering the light-emitting and non-light-emitting regions. Moreover, the method includes removing the passivation layer on the electrode to allow the non-light-emitting regions which are covered with the electrode material and the passivation layer to be higher than the light-emitting region and the electrode, thereby protecting the light-emitting region from contact with test equipment.

8 Claims, 4 Drawing Sheets

METHOD FOR FABRICATING ROBUST LIGHT-EMITTING DIODES

RELATED APPLICATION

This application is a national-stage application of and hereby claims priority under 35 U.S.C. §120, §365(c), and §371 to PCT Application No. PCT/CN2008/000596, filed 26 Mar. 2008.

BACKGROUND

1. Field of the Invention

The present invention relates to the manufacturing of semiconductor light-emitting devices using InGaAlN-based ($In_xGa_{1-x}Al_yN_{1-y}$, $0<=x<=1$, $0<=y<=1$) semiconductor material. More specifically, the present invention relates to a technique for minimizing the risk of damaging epitaxially fabricated InGaAlN-based light-emitting diodes during back side processing, testing, and packaging.

2. Related Art

Group III-V nitride compounds (e.g., GaN, InN, and AlN) and alloy compounds (e.g., AlGaN, InGaN, and AlGaInN) have been widely used in the manufacturing of light-emitting diodes (LEDs) and laser diodes that generate efficient luminescence. Techniques for epitaxially growing LEDs with group III-V nitride material include metalorganic chemical vapor deposition (MOCVD), molecular beam epitaxy (MBE), and hydride vapor phase epitaxy (HVPE).

The manufacturing of LEDs typically involves the following stages: front side processing, back side processing, testing, and packaging. During front side processing, a wafer is prepared, and LEDs are fabricated by epitaxially growing InGaAlN-based ($In_xGa_{1-x}Al_yN_{1-y}$, $0<=x<=1$, $0<=y<=1$) multilayer structures on the wafer. During back side processing, the wafer is diced to separate individual LEDs. Subsequently, each LED is tested and packaged.

Wafer bonding is one of the techniques used in the fabrication of LEDs with vertical-electrode structures. Such a fabrication process begins with fabricating an InGaAlN-based multilayer structure on a silicon growth substrate. Next, the InGaAlN-based multilayer structure is coated with a layer of metal bonding material, and a conductive substrate coated with a metal bonding layer is prepared separately. The InGaAlN-based multilayer structure and the conductive substrate are then pressure-welded using the metal bonding layer. The silicon growth substrate is subsequently removed using a wet etching technique. This way, the InGaAlN-based multilayer structure is transferred from the silicon growth substrate onto the conductive substrate, and the multilayer structure is turned "upside down." LEDs manufactured this way can benefit from a vertical-electrode configuration which results in high luminance efficiency.

However, the bond formed between the InGaAlN-based multilayer structure and the conductive substrate may not always be sufficiently strong to withstand the subsequent processing and testing. Specifically, the bond created by pressure-welding two unevenly surfaced bonding materials reduces the integrity of the contact surface and weakens the bond strength. As a result, LEDs fabricated using wafer bonding may crack when subjected to external forces in the subsequent testing process. For example, when a vacuum suction gripper lifts a device, the external force from the vacuum suction may cause the device to crack at the contact points between the device structure and the vacuum suction aperture.

SUMMARY

One embodiment of the present invention provides a method for fabricating light-emitting diodes (LEDs). The method includes fabricating an InGaAlN-based multilayer LED structure on a conductive substrate. The method further includes etching grooves of a predetermined pattern through the active region of the multilayer LED structure. The grooves separate a light-emitting region from non-light-emitting regions. In addition, the method includes depositing electrode material on the light-emitting and non-light-emitting regions, thereby creating an electrode. Furthermore, the method includes depositing a passivation layer covering the light-emitting and non-light-emitting regions. Moreover, the method includes removing the passivation layer on the electrode to allow the non-light-emitting regions which are covered with the electrode material and the passivation layer to be higher than the light-emitting region and the electrode, thereby protecting the light-emitting region from contact with test equipment.

In a variation of this embodiment, fabricating the InGaAlN-based multilayer LED structure includes patterning a growth substrate by etching grooves on the growth substrate, thereby resulting in mesas on the growth substrate; depositing the InGaAlN-based multilayer structure on a respective mesa on the growth substrate; depositing a metal bonding layer on the InGaAlN-based multilayer structure; preparing a metal bonding layer on a conductive substrate; bonding the InGaAlN-based multilayer structure with the conductive substrate; and removing the growth substrate.

In a variation of this embodiment, the predetermined pattern is a pattern of grooves etched on two opposite corners of the LED structure.

In a variation of this embodiment, the predetermined pattern is a rectangular or circular pattern of grooves etched on the LED structure, wherein the light-emitting region is enclosed in the pattern of grooves.

In a variation of this embodiment, the electrode consists of gold-germanium-nickel alloy.

In a variation of this embodiment, the passivation layer consists of silicon dioxide.

In a variation of this embodiment, removing the passivation layer on the electrode involves applying photolithography.

In a variation of this embodiment, the non-light-emitting regions which are covered with the electrode material and the passivation layer are higher than the light-emitting region and the electrode by approximately 0.1 to 2 micrometers.

In a further variation, the non-light-emitting regions which are covered with the electrode material and the passivation layer are higher than the light-emitting region and the electrode by approximately 0.5 micrometer.

BRIEF DESCRIPTION OF THE FIGURES

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Embodiments of the present invention provide a method for manufacturing high-quality light-emitting diodes (LEDs) while minimizing the risk of damaging LEDs in the testing process. Typically, after the LED structures are fabricated on a substrate, the wafer is diced to separate individual LEDs, which undergo further processes including testing and packaging. Each LED is moved around in the production line by a robotic arm, equipped with a vacuum suction channel to which a suction cup is attached. Specifically, the suction cup, made of metal or non-metal materials, grabs an LED and moves the LED to a processing station for further testing or processing.

Figure 1:
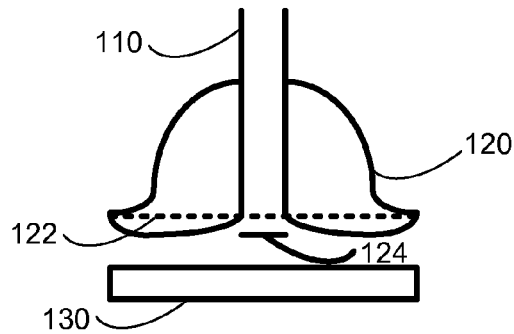
FIG. 1 presents a cross-section view of a suction cup with an attached robotic arm for LED testing.

FIG. 1 presents a cross-section view of a suction cup with an attached robotic arm for LED testing. A suction cup 120 is attached to a vacuum suction channel 110. Suction cup 120 has an outer diameter 122 and an inner diameter 124. A vacuum pump draws air away from the aperture of suction cup 120, and a vacuum is thus created within and in the vicinity of the aperture. The difference in air pressure around the aperture can be used to lift an LED device 130. Therefore, LED device 130 comes into contact with suction cup 120.

It is possible that with a large pressure difference and a rigid suction cup, the lifting process may cause damage to an LED device. For example, the contact with a suction cup may cause cracking in an LED device. Such cracking is likely to occur in the bonding material layer between an InGaAlN-based multilayer structure and a conductive substrate, if the LED device is fabricated using a wafer bonding technique. Typically the physical strength and structural integrity of the bonding layer is not as good as that of the epitaxial layers, partly due to the possible uneven surfaces of such bonding layers when the bonding material is deposited on the multilayer structure and the conductive substrate. Therefore, the force exerted on an LED by a steel suction cup could potentially crack the semiconductor material, thereby rendering the LED unusable. Using a rubber suction cup can mitigate such cracking. However, the vacuum pressure may still require careful adjustment. Moreover, a rubber suction cup has a limited life span and can be costly, thus increasing the manufacturing cost of LEDs.

One embodiment of the present invention provides a method for avoiding cracking in an LED device due to impact caused by the suction cup during a device lift-up process, by elevating the rim or corners of the device and isolating these elevated regions from the light-emitting regions. In one embodiment, grooves are etched between the elevated regions and the light-emitting region. These grooves separate a light-emitting region from non-light-emitting regions. A further process increases the height of non-light-emitting regions. Therefore, the suction cup can only contact the non-light-emitting regions with increased height, but not the light-emitting region. If cracks occur in the lifting process, these cracks only affect the non-light-emitting regions. Thus, the light-emitting regions are protected from the lifting process.

Figure 2:
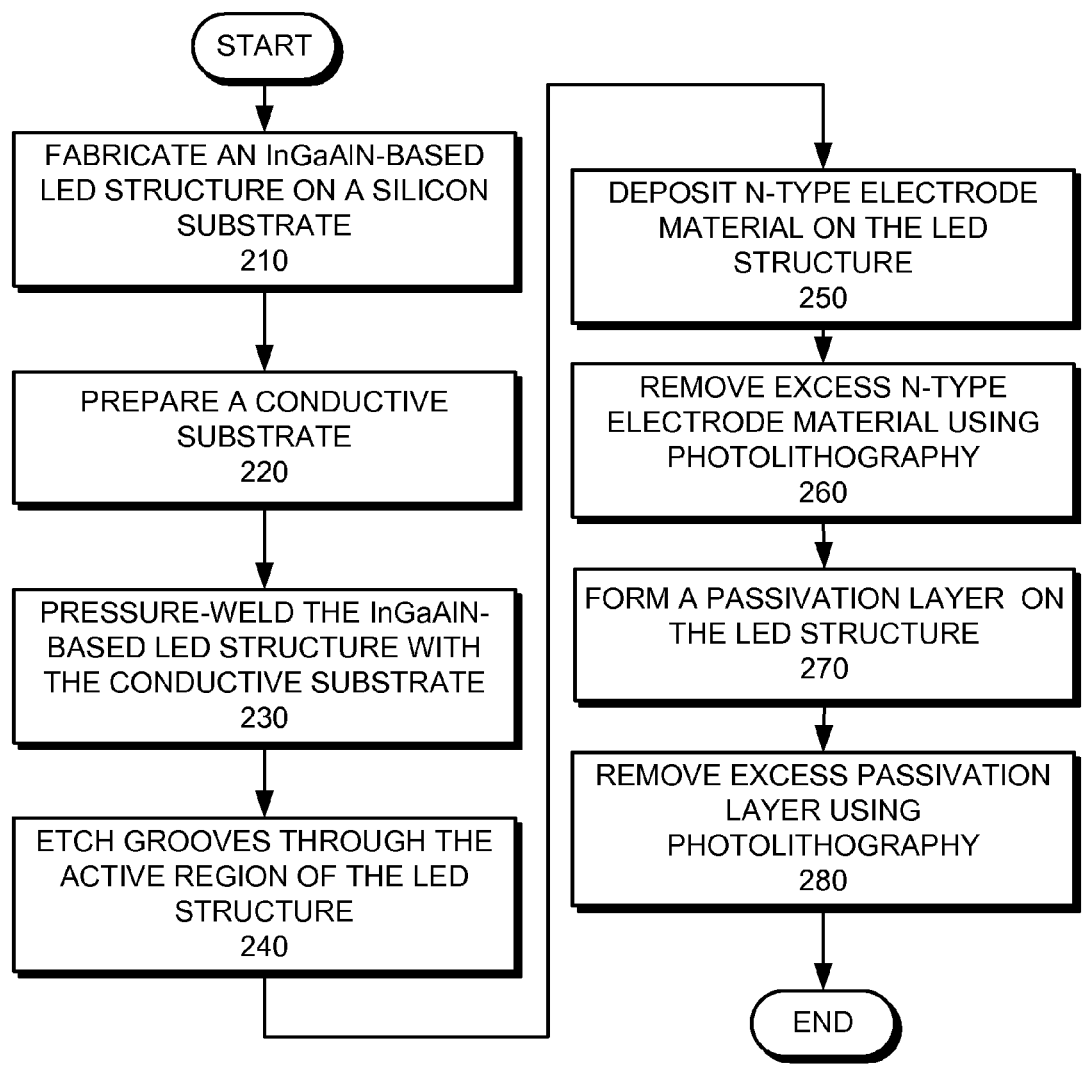
FIG. 2 presents a flow chart illustrating a fabrication process of an LED structure on a conductive substrate in accordance with one embodiment of the present invention.

FIG. 2 presents a flow chart illustrating a fabrication process of an LED structure on a conductive substrate in accordance with one embodiment of the present invention. In one embodiment, the manufacturing process of LEDs includes the following operations. First, an InGaAlN-based multilayer LED structure is fabricated on a silicon substrate and is coated with a metal bonding material (operation 210). Specifically, the silicon substrate is engraved with crisscross grooves of a predetermined pattern, which create mesas on which InGaAlN-based multilayer LED structures are fabricated. Next, a conductive substrate which is coated with a metal bonding layer is prepared (operation 220). The InGaAlN-based multilayer LED structure is then bonded with the conductive substrate using a pressure-welding technique (operation 230).

Subsequently, grooves are etched along the rim or at the corners of the LED structure through the active region (operation 240). Note that the grooves are ideally sufficiently deep to isolate the light-emitting region from the non-light-emitting regions, so that if one of the non-light-emitting regions is cracked, the light-emitting region remains operational. An n-type electrode layer is then deposited on the LED structure (operation 250). Next, the excess n-type electrode material over part of the light-emitting region which is not to be covered by an electrode is removed using photolithography (operation 260). Note that, after this removal, the electrode material only covers the non-light-emitting regions and the electrode area within the light-emitting region. A passivation layer is then formed to cover the top of the device (operation 270); Part of the passivation layer which covers the electrode in the light-emitting region is removed using photolithography (operation 280).

Figure 3A:
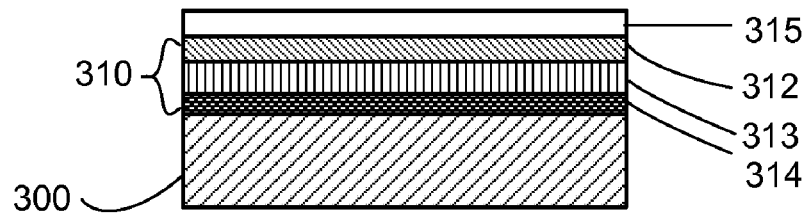
FIG. 3A illustrates a cross-section view of an InGaAlN-based multilayer LED structure which is epitaxially fabricated on a silicon growth substrate in accordance with one embodiment of the present invention.

FIGS. 3A-3H present cross-section views of different stages in the fabrication of a single LED device fabricated on a mesa on the silicon substrate. These stages correspond to those of the fabrication process illustrated in the flow chart in FIG. 2. FIG. 3A illustrates a cross-section view of an InGaAlN-based multilayer LED structure 310 which is epitaxially fabricated on a silicon growth substrate 300 (corresponding to operation 210 in FIG. 2). The top layer of LED structure 310 is a p-type layer 312 and the bottom layer is an n-type layer 314. An active multi-quantum well (MQW) layer 313 is sandwiched between p-type layer 312 and n-type layer 314. A metal bonding layer 315 is coated on top of p-type layer 312. The fabrication of LED structure 310 can use metalorganic chemical vapor deposition.

Figure 3B:
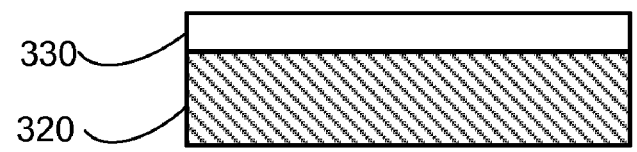
FIG. 3B illustrates a cross-section view of a conductive substrate coated with a metal bonding layer in accordance with one embodiment of the present invention.

Next, as illustrated in FIG. 3B, a conductive substrate 320 coated with a metal bonding layer 330 is prepared (corresponding to operation 220 in FIG. 2). In one embodiment, metal bonding layer 330 can be deposited on conductive substrate 320 using electron beam evaporation, magnetron sputtering, and/or any other metal coating methods. Alloys such as gold-zinc, gold-indium, and gold-tin are suitable materials for metal bonding layer 330.

Figure 3C:
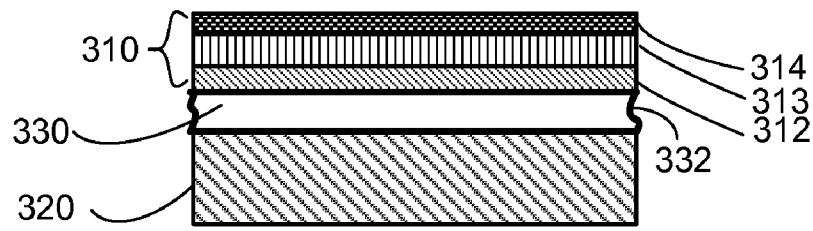
FIG. 3C illustrates a cross-section view of an InGaAlN-based multilayer LED structure fabricated on a metal substrate by wafer bonding in accordance with one embodiment of the present invention.

Corresponding to operation 230 in FIG. 2, FIG. 3C illustrates how multilayer LED structure 310 is pressure-welded to conductive substrate 320 using metal bonding layer 330. Subsequently, silicon growth substrate 300 is removed using a technique such as mechanical grinding, dry etching, or chemical etching, thereby exposing n-type layer 314. Note that sidewalls 332 of metal bonding layer 330 may suffer some damage in the pressure-welding process.

Figure 3D:
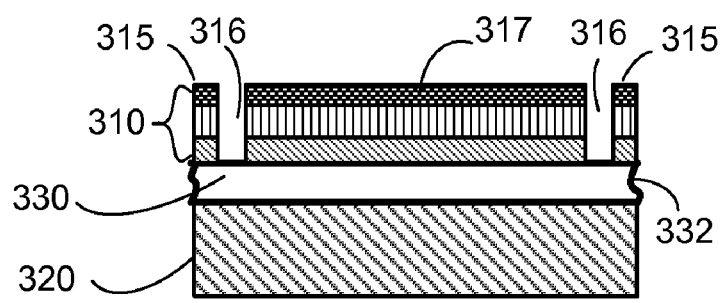
FIG. 3D illustrates a cross-section view of an InGaAlN-based multilayer LED structure on which light-emitting and non-light-emitting regions are separated in accordance with one embodiment of the present invention.

As illustrated in FIG. 3D, and corresponding to operation 240 in FIG. 2, a pattern is first selected from the group consisting of predetermined groove patterns. Then grooves 316 are etched on LED structure 310 by using, for example, metallographic etching. Note that grooves 316 penetrate LED structure 310 and reach metal bonding layer 330. At least, grooves 316 penetrate the active region in LED structure 310 to effectively isolate a light-emitting region 317, which is the middle region of LED structure 310, from non-light-emitting regions 318.

Figure 3E:
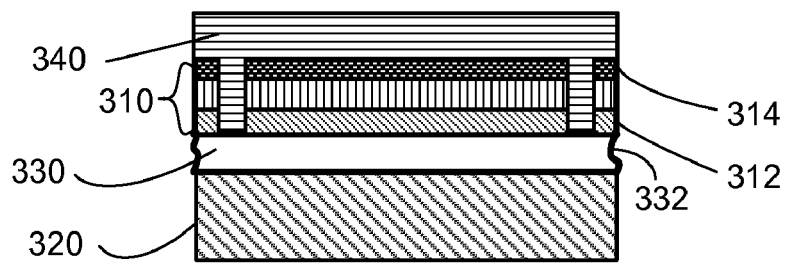
FIG. 3E illustrates a cross-section view of an InGaAlN-based multilayer LED structure covered by an n-type electrode material in accordance with one embodiment of the present invention.

As illustrated in FIG. 3E, and corresponding to operation 250 in FIG. 2, a layer of n-type electrode material 340 is then deposited on n-type layer 314. Electrode material layer 340 covers n-type layer 314 and also fills grooves 316.

Figure 3F:
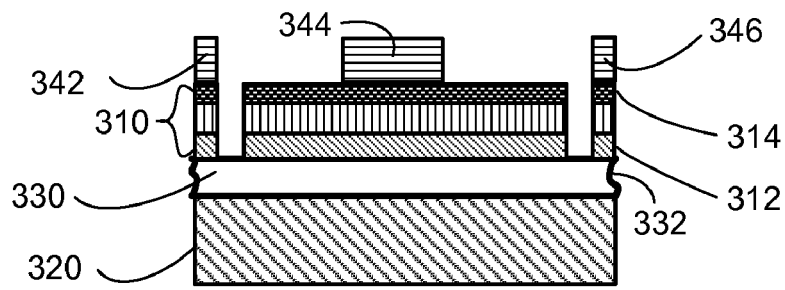
FIG. 3F illustrates a cross-section view of an InGaAlN-based multilayer LED structure on which an n-type electrode is created in accordance with one embodiment of the present invention.

As illustrated in FIG. 3F, and corresponding to operation 260 in FIG. 2, a photolithography process is then applied to remove the excess n-type electrode material deposited on n-type layer 314, thereby creating three regions 342, 344, and 346 which are covered with the electrode material. Regions 342 and 346 are located on top of the non-light-emitting regions while n-type electrode region 344 is on top of the light-emitting region. Note that only the electrode material in region 344 is used as an electrode for the light-emitting region.

Figure 3G:
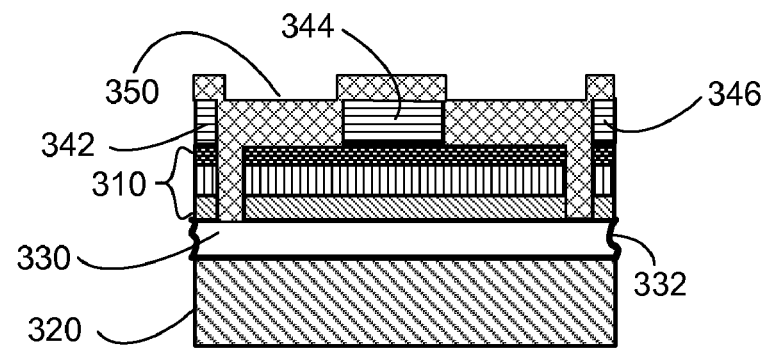
FIG. 3G illustrates a cross section of an InGaAlN-based multilayer LED structure with a passivation layer in accordance with one embodiment of the present invention.

As illustrated in FIG. 3G, and corresponding to operation 270 in FIG. 2, a passivation layer 350 is formed on the entire surface of LED structure 310, including electrode-material-covered regions 342, 344, and 346. Note that passivation layer 350 also fills the gaps between the light-emitting region and non-light-emitting regions.

Figure 3H:
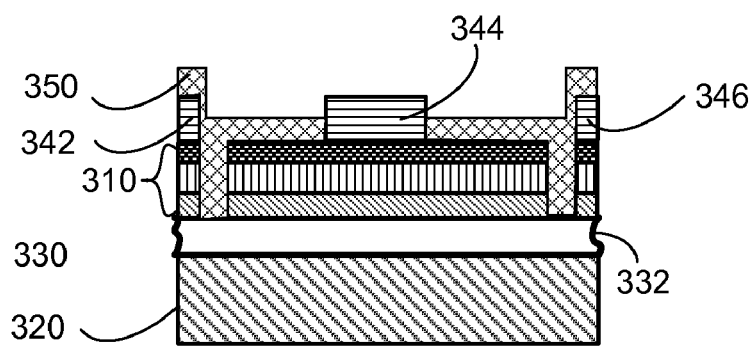
FIG. 3H illustrates a cross-section view of an InGaAlN-based multilayer LED structure with non-light-emitting regions higher than the electrode in accordance with one embodiment of the present invention.

As illustrated in FIG. 3H, and corresponding to operation 280 in FIG. 2, a photolithography process is applied to remove part of passivation layer 350 and to expose electrode 344, thereby creating passivation regions surrounding electrode 344. As a result, the non-light-emitting regions, which are now covered with passivation layer 350, are higher than electrode 344 by a predetermined amount.

Since the non-light-emitting regions are higher than the light-emitting region, during a lifting process, the suction cup only has contact with the elevated non-light-emitting regions. In other words, the areas that might be damaged by the suction cup are only the non-light-emitting regions. If cracks occur in the device testing process, they only affect the non-light-emitting regions, thus leaving the light-emitting region intact.

Figure 4A:
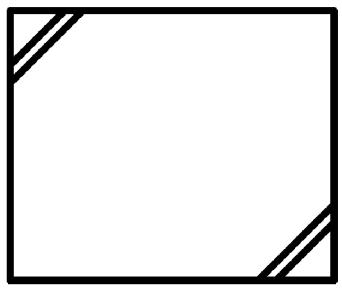
FIG. 4A illustrates a pattern of grooves etched on two opposite corners of an LED structure in accordance with one embodiment of the present invention.
Figure 4C:
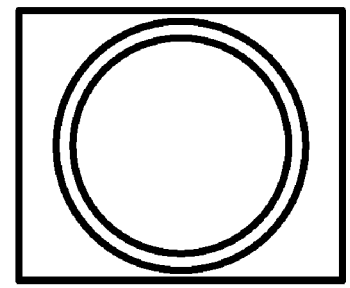
FIG. 4C illustrates a circular groove pattern etched on an LED structure in accordance with one embodiment of the present invention.
Figure 4B:
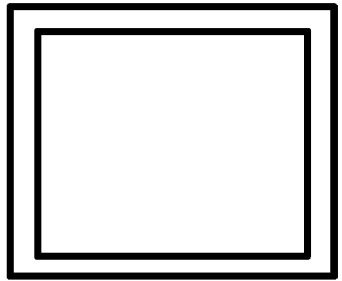
FIG. 4B illustrates a pattern of grooves etched along the perimeter of an LED structure in accordance with one embodiment of the present invention.
Figure 4D:
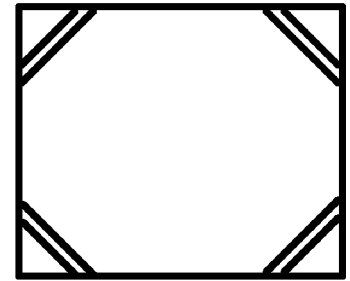
FIG. 4D illustrates a four-corner groove pattern etched on an LED structure in accordance with one embodiment of the present invention.

The following exemplary embodiment further illustrates the disclosed method. In FIGS. 4A-4D, a single LED structure is used to demonstrate exemplary predetermined groove patterns that can be etched on LED structures. FIG. 4A presents a pattern of grooves etched on two opposite corners of an LED structure. FIG. 4B presents a pattern of grooves etched along the perimeter of an LED structure. FIG. 4C presents a circular groove pattern etched on an LED structure. FIG. 4D presents a four-corner groove pattern etched on an LED structure.

Note that the aforementioned fabrication process can be performed prior to wafer dicing. In one embodiment, an InGaAlN-based multilayer LED structure is epitaxially fabricated on a silicon growth substrate using chemical vapor deposition. The LED structure comprises an AlN buffer layer, a GaN n-type layer, a GaN/InGaN multi-quantum-well layer, and a p-type layer. A metal bonding layer, which in one embodiment is based on gold, is formed on the LED structure and silicon conductive, respectively.

After the fabricated LED structure and the silicon conductive substrate are prepared, the LED structure and the silicon conductive substrate are pressure-welded using the metal bonding layer with a force of 600 kg at or below 300° C. for a predetermined period of time. Next, the entire structure is placed in a solution comprising hydrofluoric acid, nitric acid, and acetic acid until the silicon growth substrate is completely removed. Note that the newly bonded conductive substrate is protected from this wet etching process. After the wet etching process, the GaN n-type layer is exposed.

Afterwards, circular grooves are etched on the LED structure using photolithography. The inner region of the circle is a light-emitting region while the outer region is a non-light-emitting region. A layer of gold-germanium-nickel alloy, approximately 100 nanometers thick, is deposited on top of the GaN n-type layer. In addition to covering the GaN n-type layer, the gold-germanium-nickel alloy also fills the circular grooves and covers the non-light-emitting region.

Subsequently, photolithography is used to remove the excess gold-germanium-nickel alloy in the grooves. However, the gold-germanium-nickel alloy electrode layer on the outer and inner regions remains. In the following operation, a passivation layer based on $SiO_2$ is fabricated on the surface of the LED structure.

Next, photolithography is used again to remove the excess $SiO_2$ passivation layer above the electrode. The passivation layer on the rest of the light-emitting and non-light-emitting regions remains. The difference in height between the electrode and the top of the non-light-emitting region could be between 0.1 micrometer and 2 micrometers. In one embodiment, the electrode is lower than the passivation layer above the non-light-emitting region by 0.5 micrometer.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the appended claims.

What is claimed is:

1. A method for fabricating a light-emitting diode (LED), the method comprising:
    fabricating an InGaAlN-based multilayer LED structure on a conductive substrate, which involves:
    forming a growth substrate;
    depositing the InGaAlN-based multilayer LED structure on the growth substrate;
    depositing a metal bonding layer on the InGaAlN-based multilayer LED structure;
    preparing a metal bonding layer on the conductive substrate;
    bonding the InGaAlN-based multilayer LED structure with the conductive substrate; and
    removing the growth substrate; thereafter
    etching grooves of a predetermined pattern through an active region of the InGaAlN-based multilayer LED structure on the conductive substrate, thereby resulting in mesas on the conductive substrate, wherein the grooves separate a light-emitting region from non-light-emitting regions;
    depositing electrode material on the light-emitting and non-light-emitting regions, thereby creating an electrode;
    depositing a passivation layer covering the light-emitting and non-light-emitting regions; and
    removing the passivation layer on the electrode to allow the non-light-emitting regions which are covered with the electrode material and the passivation layer to be higher than the light-emitting region and the electrode, thereby protecting the light-emitting region from contact with test equipment.

2. The method of claim 1, the predetermined pattern is a pattern of grooves etched on two opposite corners of the LED structure.

3. The method of claim 1, wherein the predetermined pattern is a rectangular or circular pattern of grooves etched on the LED structure, wherein the light-emitting region is enclosed in the pattern of grooves.

4. The method of claim 1, wherein the electrode comprises gold-germanium-nickel alloy.

5. The method of claim 1, wherein the passivation layer comprises silicon dioxide.

6. The method of claim 1, wherein removing the passivation layer on the electrode comprises applying photolithography.

7. The method of claim 1, wherein the non-light-emitting regions which are covered with the electrode material and the passivation layer are higher than the light-emitting region and the electrode by approximately 0.1 to 2 micrometers.

8. The method of claim 7, wherein the non-light-emitting regions which are covered with the electrode material and the passivation layer are higher than the light-emitting region and the electrode by approximately 0.5 micrometer.

* * * * *